US00RE45257E

(19) United States
(12) Reissued Patent
Han

(10) Patent Number: US RE45,257 E
(45) Date of Reissued Patent: *Nov. 25, 2014

(54) AUTOMATIC CHANNEL MEMORY DEVICE

(75) Inventor: Baik-Hee Han, Suwon-si (KR)

(73) Assignee: Samsung Electronics Co., Ltd., Suwon-Si (KR)

( * ) Notice: This patent is subject to a terminal disclaimer.

(21) Appl. No.: 13/572,207

(22) Filed: Aug. 10, 2012

Related U.S. Patent Documents

Reissue of:
(64) Patent No.: 6,995,809
Issued: Feb. 7, 2006
Appl. No.: 09/487,729
Filed: Jan. 19, 2000

U.S. Applications:
(63) Continuation of application No. 12/021,182, filed on Jan. 28, 2008, now Pat. No. Re. 43,664.

(30) Foreign Application Priority Data

Jan. 22, 1999 (KR) ..... 1999-1938

(51) Int. Cl.
*H04N 5/50* (2006.01)

(52) U.S. Cl.
USPC ..... 348/732

(58) Field of Classification Search
USPC ..... 348/732, 731, 725, 714, 553, 554, 348/563–569
See application file for complete search history.

(56) References Cited

U.S. PATENT DOCUMENTS

| | | | | |
|---|---|---|---|---|
| 4,236,182 | A | 11/1980 | Minoura et al. | |
| 4,295,165 | A * | 10/1981 | Watanabe et al. | 348/732 |
| 4,422,096 | A * | 12/1983 | Henderson | 348/731 |
| 4,451,850 | A * | 5/1984 | Kamemoto | 348/731 |
| 4,525,866 | A * | 6/1985 | Templin | 455/186.2 |
| 4,737,993 | A * | 4/1988 | DeVilbiss | 455/180.1 |
| 4,897,727 | A * | 1/1990 | Richards | 348/734 |
| 5,034,819 | A * | 7/1991 | Tsukagoshi | 348/732 |
| 5,087,977 | A * | 2/1992 | Suizu | 348/732 |
| 5,253,067 | A | 10/1993 | Chaney et al. | |
| 5,299,011 | A * | 3/1994 | Choi | 348/732 |

(Continued)

FOREIGN PATENT DOCUMENTS

| | | |
|---|---|---|
| CN | 1073818 A | 6/1993 |
| DE | 26 48 882 | 5/1978 |

(Continued)

OTHER PUBLICATIONS

Chinese First Office Action with English Translation issued on Oct. 25, 2002 in corresponding Chinese Patent Application No. 00100828.5.

(Continued)

*Primary Examiner* — Paulos M Natnael
(74) *Attorney, Agent, or Firm* — Sughrue Mion, PLLC

(57) ABSTRACT

In a broadcasting signal processor, an automatic channel memory device for determining whether a broadcasting signal is present in a channel tuned according to user's selection, and for automatically memorizing the tuned channel if a broadcasting signal is present in the tuned channel, is provided. A user's selected broadcasting channel can be accurately stored in a memory without using a separate memory button, thereby simplifying key operation.

15 Claims, 3 Drawing Sheets

(56) References Cited

U.S. PATENT DOCUMENTS

| | | | | | |
|---|---|---|---|---|---|
| 5,410,361 | A * | 4/1995 | Lee | 348/570 |
| 5,428,405 | A * | 6/1995 | Lee | 348/731 |
| 5,438,377 | A * | 8/1995 | Chang | 348/731 |
| 5,481,256 | A * | 1/1996 | Darbee et al. | 340/825.56 |
| 5,483,684 | A * | 1/1996 | Ono et al. | 455/161.2 |
| 5,512,955 | A * | 4/1996 | Toyoshima et al. | 348/569 |
| 5,604,543 | A * | 2/1997 | Baek | 348/564 |
| 5,710,992 | A * | 1/1998 | Sawada et al. | 455/161.2 |
| 5,771,080 | A * | 6/1998 | Sakakibara | 348/731 |
| 5,786,869 | A * | 7/1998 | Baek et al. | 348/565 |
| 5,877,822 | A * | 3/1999 | Tazine et al. | 348/731 |
| 5,963,269 | A * | 10/1999 | Beery | 348/570 |
| 5,969,769 | A * | 10/1999 | Hamadate | 348/568 |
| 6,204,888 | B1 * | 3/2001 | Kim | 348/570 |
| 6,215,531 | B1 * | 4/2001 | Beery | 348/734 |
| 6,317,168 | B1 * | 11/2001 | Seo | 348/725 |
| 6,344,882 | B1 * | 2/2002 | Shim et al. | 348/731 |
| 6,400,421 | B1 * | 6/2002 | Sakakibara | 348/732 |
| 6,400,422 | B1 * | 6/2002 | Nakamura | 348/732 |
| 6,600,522 | B1 * | 7/2003 | Kim | 348/732 |
| 6,995,809 | B1 | 2/2006 | Han | |
| RE43,664 | E * | 9/2012 | Han | 348/732 |

FOREIGN PATENT DOCUMENTS

| | | |
|---|---|---|
| DE | 28 18 956 | 12/1985 |
| GB | 1 588 598 | 4/1981 |
| GB | 2348330 A * | 9/2000 |
| KR | 1998-14123 | 6/1998 |
| KR | 98-56950 | 9/1998 |
| KR | 10-1999-0001938 | 11/2000 |
| KR | 1999-0001938 | 11/2000 |

OTHER PUBLICATIONS

Peltz, G. "Abstimmsystem mit Spannungs-Synthese für Fernseh-und Rundfunk-empfänger" IN: Funk-Technik 1984, vol. 6, pp. 238-240.

Karstad, K. "Microprocessor Control for Color TV Receivers", IN: IEEE Transact. On Consumer Electronics, vol. CE-26, May 1980, pp. 149-155.

* cited by examiner

AUTOMATIC CHANNEL MEMORY DEVICE

Matter enclosed in heavy brackets [ ] appears in the original patent but forms no part of this reissue specification; matter printed in italics indicates the additions made by reissue.

*More than one reissue application has been filed for the reissue of U.S. Pat. No. 6,995,809 filed Jan. 19, 2000. The present application is a continuation reissue application of U.S. application Ser. No. 12/021,182 filed Jan. 28, 2008, which is a parent reissue application of the present continuation reissue application now U.S. Pat. No. Re. 43,664.*

BACKGROUND OF THE INVENTION

1. Field of the Invention

The present invention relates to a broadcasting signal processor, and more particularly, to an automatic channel memory device for determining whether a broadcasting signal is present in a channel tuned according to user's selection, and for automatically memorizing the tuned channel if a broadcasting signal is present in the tuned channel.

2. Description of the Related Art

In a conventional channel memory method, in order to memorize a tuned channel, first, a user selects a desired channel using a digit button on a remote controller and then presses a channel memory button (10 of FIG. 1) to memorize the tuned channel. In a second conventional channel memory method a menu setting key for setting a menu screen (12 of FIG. 1) is pressed to scan all channels and then channels having a broadcasting signal are automatically memorized.

However, in the former method, if the channel memory button is not pressed after pressing the digit button for the tuned channel, the desired channel cannot be memorized. In the latter method, a specific menu must be set, which is inconvenient in practical use.

SUMMARY OF THE INVENTION

To solve the above problems, it is an objective of the present invention to provide a channel memory device for determining whether a signal is present in a tuned channel when a channel is tuned, and for automatically memorizing the channel number if a signal is present in the tuned channel.

Accordingly, to achieve the above objective, there is provided a channel memory device in a broadcasting signal processor, including a key input for inputting a predetermined channel number according to a user's selection, a tuner for tuning to a channel corresponding to the channel number selected by the key input, among received broadcasting signals, a signal processor for processing a composite video signal of a channel tuned and output from the tuner, a memory for storing the predetermined channel number, and a controller for receiving the channel number output from the key input and storing the channel number output from the key input in the memory while controlling the tuner to tune to a broadcasting channel corresponding to the received channel number.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Figure 2:
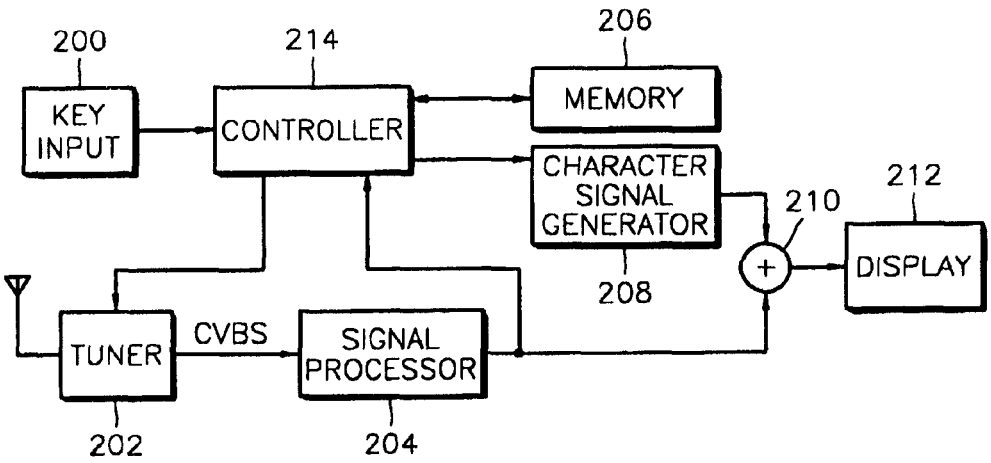
FIG. 2 is a schematic block diagram illustrating an automatic channel memory device according to the present invention.

As shown in FIG. 2, an automatic channel memory device according to the present invention includes a key input 200, a tuner 202, a signal processor 204, a memory 206, a character signal generator 208, a mixer 210, a display 212 and a controller 214.

Figure 3:
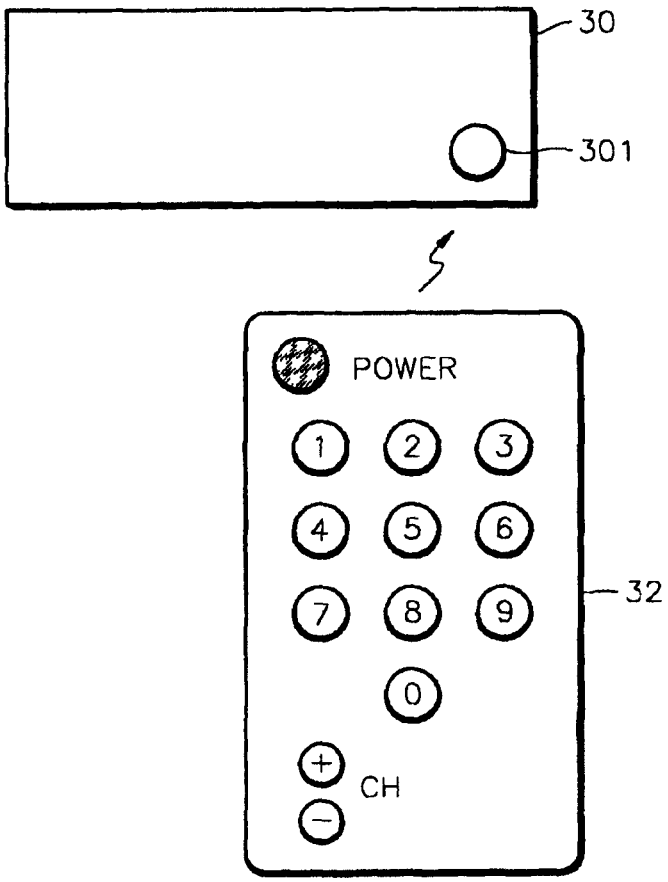
FIG. 3 is a diagram illustrating the key input shown in FIG. 2 and a main body of a broadcasting signal receiver.

FIG. 3 shows a key input and a main body of a broadcasting signal receiver, in which reference numeral 30 denotes the main body, and reference numeral 32 denotes a remote controller. In particular, a light receiving element 301 for receiving light incident from the remote controller 32 is provided in a specific portion of the main body 30.

Figure 1:
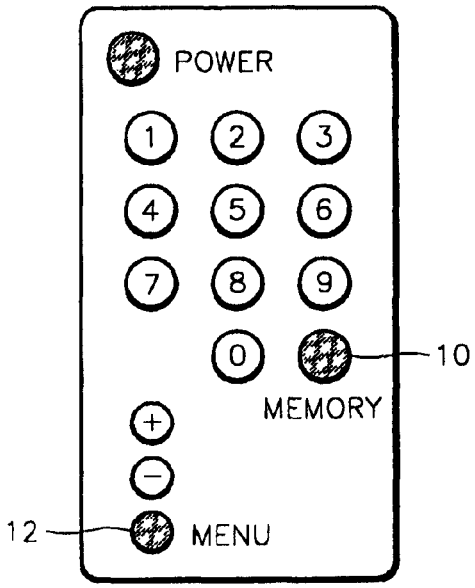
FIG. 1 (PRIOR ART)
FIG. 1 is a diagram illustrating parts of a remote controller used in a conventional television system.

The key input 200 includes a typical remote controller, having digit buttons, as shown in FIG. 3. Unlike the remote controller shown in FIG. 1, in the present invention, a memory button is not provided in the remote controller.

The tuner 202 tunes to a channel selected among broadcasting signals received through an antenna, in response to the control of the controller 214.

The signal processor 204 processes a composite video signal tuned and output from the tuner 202.

The memory 206 selectively stores channel numbers corresponding to all tuned channels or channels having broadcasting signals among the tuned channels in accordance with the control of the controller 214.

The character signal generator 208 generates a tuned channel number and a character signal "memory display".

The mixer 210 mixes a signal output from the signal processor 204 with a signal output from the character signal generator 208.

The display 212 displays a signal output from the mixer 210.

The controller 214 receives the channel number output from the key input 200 and stores the channel number output from the key input 200 in the memory 206 while controlling the tuner 202 to tune to a broadcasting channel corresponding to the received channel number. In particular, the controller 214 receives the signal output from the signal processor 204, determines whether or not a broadcasting signal is present in the currently tuned broadcasting channel, and stores the corresponding broadcasting channel number in the memory 206 only when a broadcasting signal is present. Also, the controller 214 controls the character signal generator 208 to generate a channel number for the channel which is currently being broadcast, denoted by reference numeral 40, and a character signal of "memory display" denoted by reference numeral 42, as shown in FIG. 4, so that a user can easily identify the memorized broadcasting channel.

Figure 4:
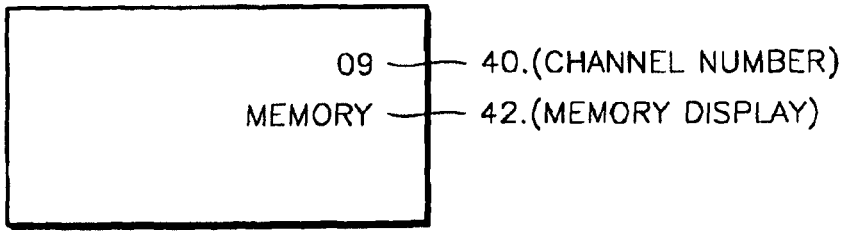
FIG. 4 is a diagram illustrating an example of displaying a channel number currently being broadcast and a character signal representing "memory display".
Figure 3A:
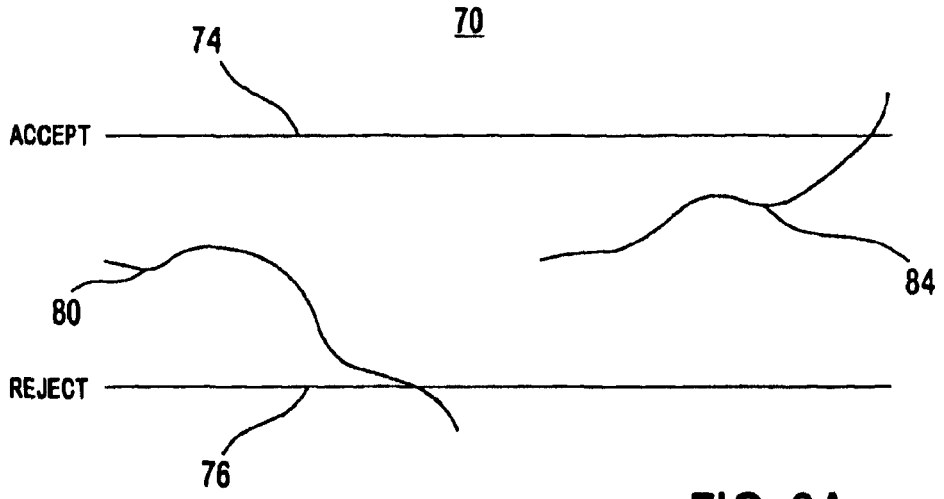
Figure 3B:
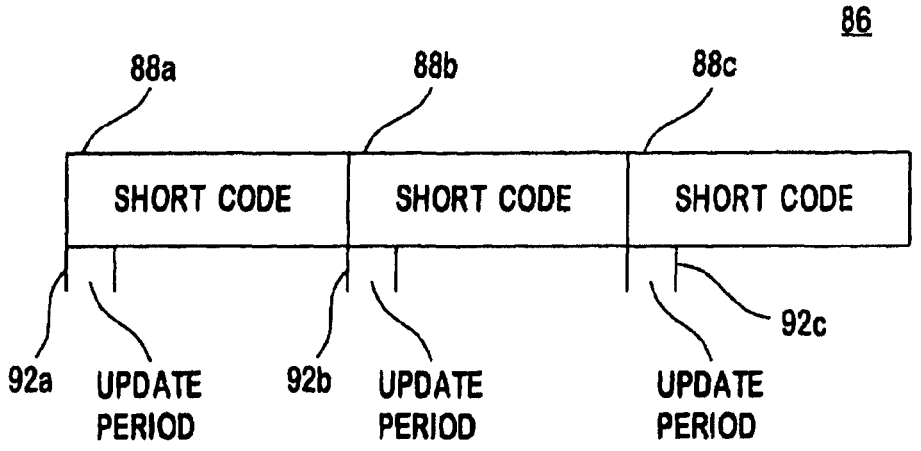

Thus, the signal output from the signal processor 204 and the signal output from the character signal generator 208 are mixed to then be displayed on the display 212, as shown in FIG. 4.

If the channel number is stored in the memory 206 in such a manner, the user can select a desired channel using a channel up/down button.

As described above, according to the present invention, a user's selected broadcasting channel can be accurately stored in a memory without using a separate memory button, thereby simplifying key operation.

What is claimed is:

[1. A channel memory device in a broadcasting signal processor, comprising:

a key input for inputting a channel number according to a user's selection; a tuner for tuning to the channel corresponding to the channel number selected by the key input, among received broadcasting signals;

a signal processor for processing a composite video signal of said channel tuned and output from the tuner;

a memory for storing the channel number; and a controller for receiving the channel number output from the key input and storing the channel number output from the key input in the memory while controlling the tuner to tune to a broadcasting channel corresponding to the received channel number, wherein the controller receives a signal output from the signal processor, determines whether a broadcasting signal is present in the currently tuned broadcasting channel and stores the corresponding broadcasting channel number in the memory only if said broadcasting signal is present.]

[2. The channel memory device according to claim 1, further comprising:

a character signal generator for generating a character signal for indicating the memorization of the channel number selected by the key input;

a mixer for mixing a signal output from the signal processor with a signal output from the character signal generator; and a display for displaying a signal output from the mixer.]

[3. The channel memory device according to claim 2, wherein the controller controls the character signal generator to generate a current broadcasting channel number and a character signal indicating the memorization of the channel number, so that said user can easily identify the memorized broadcasting channel.]

[4. A channel memory device in a broadcasting signal processor, comprising:

a key input for inputting a channel number according to a user's selection;

a tuner for tuning to a channel corresponding to the channel number selected by the key input, among received broadcasting signals;

a signal processor for processing a composite video signal of said channel tuned and output from the tuner;

a memory for storing the channel number; and a controller for receiving the channel number output from the key input and automatically storing the channel number output from the key input in the memory while controlling the tuner to tune to a broadcasting channel corresponding to the received channel number, wherein the controller receives a signal output from the signal processor, determines whether a broadcasting signal is present in the currently tuned broadcasting channel and stores the corresponding broadcasting channel number in the memory only if said broadcasting signal is present.]

[5. The channel memory device according to claim 4, further comprising:

a character signal generator for generating a character signal for indicating the memorization of the channel number selected by the key input;

a mixer for mixing a signal output from the signal processor with a signal output from the character signal generator; and a display for displaying a signal output from the mixer.]

[6. The channel memory device according to claim 5, wherein the controller controls the character signal generator to generate a current broadcasting channel number and a character signal indicating the memorization of the channel number, so that said user can easily identify the memorized broadcasting channel.]

*7. A broadcast signal receiving device comprising:*

*a remote control unit having a plurality of buttons for inputting a channel number according to a user's selection;*

*a tuner for tuning to a channel of the channel number selected on the remote control unit by a user, among received broadcast channels;*

*a signal processor for processing a signal of the channel tuned and output from the tuner;*

*a channel map memory for storing memorized channels; and*

*a controller for storing the channel number in the channel map memory without receiving two or more input operations on the remote control unit by a user in selecting the channel number on the remote control unit for the tuning to the channel and storing the channel number in the channel map memory, if the controller determines that a broadcast signal is present in the tuned channel,*

*wherein the tuned channel is not an automatically scanned channel.*

*8. A broadcast signal receiving device comprising:*

*a remote control unit having a plurality of buttons for inputting a channel number according to a user's selection;*

*a tuner for tuning to a channel, corresponding to the channel number selected by the remote control unit, among received broadcast channels;*

*a signal processor for processing a signal of the channel tuned and output from the tuner;*

*a channel map memory for storing memorized channels; and*

*a controller for storing the channel number in the channel map memory without receiving an additional input operation by the user via the remote control unit after the channel number is selected, if the controller determines that a broadcast signal is present in the tuned channel,*

*wherein the tuned channel is not an automatically scanned channel.*

*9. The broadcast signal receiving device according to claim 8, the additional input operation is an input operation which is operated by the user's input selecting one or more buttons on the remote control unit.*

*10. The broadcast signal receiving device according to claim 8, the additional input operation is an input operation which is operated by the user's input selecting a menu displayed on a screen of the broadcast signal receiving device.*

*11. The broadcast signal receiving device according to claim 8, further comprising:*

*a character signal generator for generating a character signal for indicating memorization of the channel selected by the remote control unit;*

*a mixer for mixing the processed signal output from the signal processor with the character signal output from the character signal generator; and*

*a display for displaying the mixed signal output from the mixer.*

*12. The broadcast signal receiving device according to claim 11, wherein the controller controls the character signal generator to generate the channel number, and a character signal indicating memorization of the channel number, so that said the user can easily identify the memorized channel number.*

*13. The broadcast signal receiving device according to claim 8, wherein the controller determines that the broadcast signal is present in the tuned channel by determining that the broadcast signal is output from the signal processor.*

*14. The broadcast signal receiving device according to claim 13, wherein the broadcast signal output from the signal processor is a composite video signal.*

*15. A method of memorizing channels in a broadcast signal receiving device, the steps comprising:*

*inputting a channel number according to a user's selection;*

*tuning to a channel, corresponding to the channel number, among received broadcast channels;*

*processing a signal of the channel tuned; and*

*storing the channel number without receiving multiple input operations by the user via a remote controller after the channel number is selected, if a broadcast signal is present in the tuned channel,*

*wherein the tuned channel is not an automatically scanned channel.*

*16. The method of memorizing channels in a broadcast signal device according to claim 15, the multiple input operations are input operations which are operated by the user's inputs selecting buttons of the remote controller.*

*17. The broadcast signal receiving device according to claim 15, the multiple input operations are input operations which are operated by the user's inputs selecting menus displayed on a screen of the broadcast signal receiving device.*

*18. The method of memorizing channels in a broadcast signal device according to claim 15, the steps further comprising:*

*generating a character signal for indicating memorization of the channel;*

*mixing the processed signal output from the processing the signal of the channel tuned with the character signal output from the generating the character signal; and*

*displaying the mixed signal output from the mixer.*

*19. The method of memorizing channels in a broadcast signal device according to claim 18, wherein the generating the character signal comprises generating the channel number and a character signal indicating memorization of the channel number, so that the user can easily identify the memorized channel number.*

*20. The method of memorizing channels in a broadcast signal device according to claim 15, further comprising determining that the broadcast signal is present in the tuned channel by determining that the broadcast signal is output from the processing the signal of the channel tuned.*

*21. The method of memorizing channels in a broadcast signal device according to claim 20, wherein the broadcast signal output from the processing the signal of the channel tuned is a composite video signal.*

* * * * *